United States Patent
Hwang

(10) Patent No.: US 9,583,687 B2
(45) Date of Patent: Feb. 28, 2017

(54) SEMICONDUCTOR DEVICE, SEMICONDUCTOR DEVICE PACKAGE, AND LIGHTNING APPARATUS

(71) Applicant: Seok Min Hwang, Pusan (KR)

(72) Inventor: Seok Min Hwang, Pusan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 14/729,619

(22) Filed: Jun. 3, 2015

(65) Prior Publication Data
US 2016/0133807 A1 May 12, 2016

(30) Foreign Application Priority Data

Nov. 10, 2014 (KR) .................. 10-2014-0154974

(51) Int. Cl.
| | |
|---|---|
| H01L 33/44 | (2010.01) |
| H01L 33/38 | (2010.01) |
| H01L 33/62 | (2010.01) |
| H01L 33/32 | (2010.01) |

(52) U.S. Cl.
CPC ............ *H01L 33/62* (2013.01); *H01L 33/32* (2013.01); *H01L 33/385* (2013.01); *H01L 33/44* (2013.01); *H01L 2224/16245* (2013.01); *H01L 2924/181* (2013.01)

(58) Field of Classification Search
CPC ... H01L 29/20; H01L 33/00; H01L 31/03046; H01L 31/03048; H01L 31/1844; H01L 31/1848; H01L 2924/0134
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| KR | 102002006030 A | 7/2002 |
| KR | 102002007058 A | 9/2002 |

(Continued)

*Primary Examiner* — Allen Parker
*Assistant Examiner* — Gustavo Ramallo
(74) *Attorney, Agent, or Firm* — Harness, Dickey & Pierce, P.L.C.

(57) ABSTRACT

A semiconductor device includes a light emitting structure, and an interconnection bump including an under bump metallurgy (UBM) layer disposed on an electrode of at least one of the first and second conductivity-type semiconductor layers, and having a first surface disposed opposite to a surface of the electrode and a second surface extending from an edge of the first surface to be connected to the electrode, an intermetallic compound (IMC) disposed on the first surface of the UBM layer, a solder bump bonded to the UBM layer with the IMC therebetween, and a barrier layer disposed on the second surface of the UBM layer and substantially preventing the solder bump from being diffused into the second surface of the UBM layer.

20 Claims, 15 Drawing Sheets

(56) References Cited

U.S. PATENT DOCUMENTS

| | | | |
|---|---|---|---|
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,727,882 B1 * | 6/2010 | Wu | H01L 21/2855 257/E21.584 |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,003,512 B2 | 8/2011 | Belanger et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,778,792 B2 | 7/2014 | Daubenspeck et al. | |
| 2002/0096764 A1 * | 7/2002 | Huang | H01L 24/11 257/737 |
| 2004/0121267 A1 | 6/2004 | Jang | |
| 2005/0151269 A1 * | 7/2005 | Song | H01L 23/13 257/778 |
| 2005/0176234 A1 * | 8/2005 | Shei | H01L 24/11 438/613 |
| 2006/0220259 A1 * | 10/2006 | Chen | H01L 21/563 257/778 |
| 2006/0286697 A1 * | 12/2006 | Leem | H01L 33/22 438/27 |
| 2007/0069394 A1 | 3/2007 | Bachman et al. | |
| 2008/0251916 A1 * | 10/2008 | Cheng | H01L 24/11 257/738 |
| 2008/0265269 A1 * | 10/2008 | Yoo | C09K 11/0883 257/98 |
| 2009/0200570 A1 * | 8/2009 | Mori | H01L 33/642 257/99 |
| 2010/0112353 A1 * | 5/2010 | Sun | B23K 35/262 428/407 |
| 2010/0187687 A1 * | 7/2010 | Liu | H01L 23/3157 257/738 |
| 2011/0018130 A1 * | 1/2011 | Yamada | H01L 24/06 257/737 |
| 2012/0007228 A1 * | 1/2012 | Lu | H01L 24/13 257/692 |
| 2014/0170850 A1 | 6/2014 | Yu et al. | |

FOREIGN PATENT DOCUMENTS

| | | |
|---|---|---|
| KR | 102003006691 A | 8/2003 |
| KR | 102004005636 A | 6/2004 |
| KR | 102007008316 A | 8/2007 |
| WO | WO-2007097508 A1 | 8/2007 |

* cited by examiner

SEMICONDUCTOR DEVICE, SEMICONDUCTOR DEVICE PACKAGE, AND LIGHTNING APPARATUS

CROSS-REFERENCE TO RELATED APPLICATION

This application claims the benefit of priority from Korean Patent Application No. 10-2014-0154974 filed on Nov. 10, 2014, with the Korean Intellectual Property Office, the disclosure of which is incorporated herein by reference in its entirety.

BACKGROUND

Example embodiments relate to a semiconductor device, a semiconductor device package, and/or a lighting apparatus.

A solder bump formed on an electrode of a semiconductor chip including a light emitting diode (LED) may be formed by forming a solder on an under bump metallurgy (UBM) layer and reflowing the solder.

Due to a phase change in the solder during the reflow process, an intermetallic compound (IMC) formed between the solder and the UBM layer may diffuse into lateral surfaces of the UBM layer due to wettability of the UBM layer, so as to be in contact with the electrode. Residual stress generated by the phase change may cause cracks in the IMC in a relatively brittle portion thereof, in contact with the electrode, whereby the solder bump may be separated from the electrode.

SUMMARY

Example embodiments may provide a plan of reducing or substantially preventing an occurrence of cracks in an intermetallic compound (IMC).

According to example embodiments, a semiconductor device may include a light emitting structure and second conductivity-type semiconductor layers formed of or including $Al_xIn_yGa_{(1-x-y)}N$, wherein $0 \leq x < 1$, $0 \leq y < 1$, and $0 \leq x+y < 1$, and an active layer disposed between the first and second conductivity-type semiconductor layers, and an interconnection bump including an under bump metallurgy (UBM) layer disposed on an electrode of at least one of the first and second conductivity-type semiconductor layers, and having a first surface disposed opposite to a surface of the electrode and a second surface extending from an edge of the first surface to be connected to the electrode, an intermetallic compound (IMC) disposed on the first surface of the UBM layer, a solder bump bonded to the UBM layer with the IMC therebetween, and a barrier layer disposed on the second surface of the UBM layer and substantially preventing the solder bump from being diffused into the second surface of the UBM layer.

A formation of the IMC or the solder bump may be absent from the barrier layer.

The barrier layer may include an oxide layer containing at least one element of the UBM layer.

The barrier layer may include an oxide layer containing at least one of nickel (Ni) and copper (Cu).

The barrier layer may have a lower level of wettability with respect to the IMC and the solder bump than a level of wettability with respect to the UBM layer.

The second surface of the UBM layer may have a structure slightly inclined towards the electrode from the first surface of the UBM layer.

The second surface of the UBM layer may be substantially perpendicular to the surface of the electrode.

The UBM layer may have a multilayer structure including a titanium (Ti) layer in contact with the electrode, and a Ni layer or a Cu layer disposed on the Ti layer.

The UBM layer may have a multilayer structure including a chromium (Cr) layer in contact with the electrode, and a Ni layer or a Cu layer disposed on the Cr layer.

The UBM layer may have a monolayer structure formed as or including one of a Ni layer or a Cu layer.

The semiconductor device may further include a passivation layer disposed adjacently to the UBM layer on the electrode.

The passivation layer may be disposed to be separated from the UBM layer by being spaced apart therefrom, on the electrode.

The passivation layer may have a thickness that is lower than a thickness of the UBM layer.

According to example embodiments, a semiconductor device may include a light emitting structure including a plurality of electrodes and an interconnection bump disposed on the plurality of electrodes, wherein the interconnection bump includes a UBM layer disposed on the electrode, the UBM layer having a first surface disposed opposite to a surface of the electrode and a second surface extending from an edge of the first surface to be connected to the electrode, an IMC disposed on the first surface of the UBM layer, a solder bump bonded to the UBM layer with the IMC therebetween, and a barrier layer disposed on the second surface of the UBM layer, the barrier layer substantially preventing the solder bump from being diffused into the second surface of the UBM layer.

The plurality of electrodes may be disposed in a single direction in the light emitting structure.

The light emitting structure may include first and second conductivity-type semiconductor layers formed of or including $Al_xIn_yGa(1-x-y)N$, wherein $0 \leq x < 1$, $0 \leq y < 1$, and $0 \leq x+y < 1$, and an active layer disposed between the first and second conductivity-type semiconductor layers.

According to example embodiments, a semiconductor device package may include a package main body, a semiconductor device mounted on the package main body, and an encapsulating portion encapsulating the semiconductor device.

The encapsulating portion may contain at least one type of phosphor.

According to example embodiments, a lighting apparatus may include a housing, and at least one semiconductor device package in the housing.

The lighting apparatus may further include a cover unit installed in the housing and encapsulating the at least one semiconductor device package.

BRIEF DESCRIPTION OF DRAWINGS

The above and other features and advantages of example embodiments will be more clearly understood from the following detailed description taken in conjunction with the accompanying drawings, in which.

DETAILED DESCRIPTION

Figure 1:
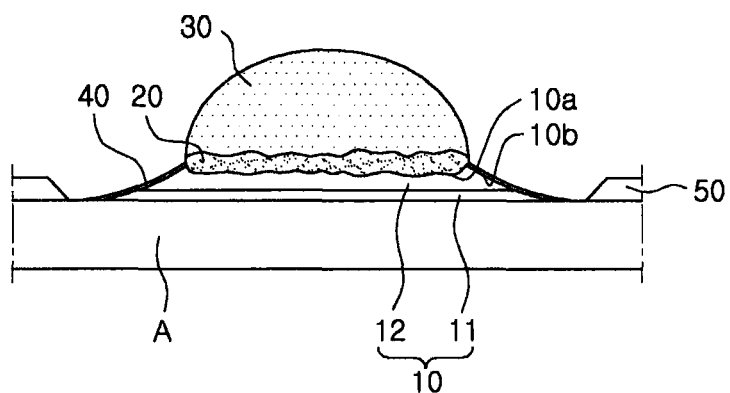
FIG. 1 is a cross-sectional view schematically illustrating an interconnection bump of a semiconductor device according to an example embodiment.

Hereinafter, example embodiments will be described in detail with reference to the accompanying drawings.

The example embodiments may, however, be exemplified in many different forms and should not be construed as being limited to the specific embodiments set forth herein. Rather, these embodiments are provided for thoroughness and completeness, and fully convey the scope to those skilled in the art.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawings, the shapes and dimensions of elements may be exaggerated for clarity, and the same reference numerals will be used throughout to designate the same or like elements. In example embodiments, terms such as "top surface," "upper portion," "edge," "lower surface," "below," "lateral surface," and the like, are determined based on the drawings, and in actuality, the terms may be changed according to a direction in which a semiconductor device is disposed in actuality.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, an interconnection bump of a semiconductor device according to an example embodiment will be described with reference to FIG. 1. FIG. 1 is a cross-sectional view schematically illustrating an interconnection bump of a semiconductor device according to an example embodiment.

Referring to FIG. 1, an interconnection bump 1 of a semiconductor device according to an example embodiment may include an under bump metallurgy (UBM) layer 10, an intermetallic compound (IMC) 20, a solder bump 30, and barrier layers 40, and may further include a passivation layer 50.

The UBM layer 10 may increase interfacial bonding strength between an electrode A of the semiconductor device and the solder bump 30, and may also provide an electrical path. In addition, the UBM layer 10 may reduce or substantially prevent solder material from diffusing into the electrode during a reflow process. That is, an element forming the solder may be substantially prevented from permeating into the electrode A.

The UBM layer 10 may have a first surface 10a disposed opposite to a surface of the electrode A and in contact with the IMC 20 on an upper portion of the electrode A, and second surfaces 10b extending from edges of the first surface 10a, respectively, to be connected to the electrode A.

The first surface 10a may have an overall flat structure, and may define a top surface of the UBM layer 10. The second surfaces 10b may have a structure slightly inclined towards the electrode A from the first surface 10a, and may define lateral surfaces of the UBM layer 10.

Figure 2:
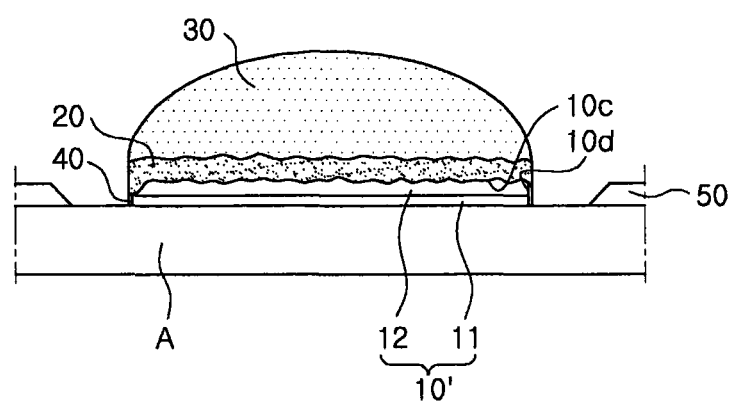
FIG. 2 is a cross-sectional view schematically illustrating a modified example of the interconnection bump of FIG. 1.

FIG. 2 is a cross-sectional view schematically illustrating a modified example of the aforementioned interconnection bump. As illustrated in FIG. 2, a UBM layer 10' may have a structure in which second surfaces 10d of the UBM layer 10' extend vertically towards the electrode A from a first surface 10c of the UBM layer 10'.

The UBM layer 10 may be formed of or include a metallic material electrically connected to the electrode A.

For example, the UBM layer 10 may have a multilayer structure including a titanium (Ti) layer 11 in contact with the electrode A and a nickel (Ni) layer 12 disposed on the Ti layer 11. In addition, although not illustrated, the UBM layer 10 may have a multilayer structure including a copper (Cu) layer disposed on the Ti layer 11, in lieu of the Ni layer 12.

Although the example embodiment illustrates the UBM layer 10 having a multilayer structure of Ti—Ni, the type of layers to be included in the multilayer structure of the UBM layer 10 is not limited thereto. For example, the UBM layer 10 may have a multilayer structure including a chromium (Cr) layer in contact with the electrode A and a Ni layer disposed on the Cr layer, or a multilayer structure including a Cr layer and a Cu layer disposed on the Cr layer.

In addition, although the example embodiment illustrates the UBM layer 10 having a multilayer structure, the type of structure of the UBM layer 10 is not limited thereto. For example, the UBM layer 10 may have a monolayer structure formed as or including one of a Ni layer and a Cu layer.

For example, the UBM layer 10 may be formed via a sputtering process, an e-beam deposition process, or a plating process.

The IMC 20 may be formed on the first surface 10a of the UBM layer 10. The IMC 20 may be formed during a reflow process in which the solder bump 30 is formed. The IMC 20 may be formed via a reaction between an element within the solder, for example, tin (Sn), and a metal in the UBM layer 10, for example, Ni, and may form a Sn—Ni binary alloy.

The solder bump 30 may be bonded to the UBM layer 10 with the IMC 20 therebetween. That is, the solder bump 30 may be firmly bonded to the UBM layer 10 by the IMC 20 serving as a type of adhesive.

The solder bump 30 may be formed by reflowing the solder disposed on the UBM layer 10. For example, a general alloy material such as SAC305 ($Sn_{96.5}Ag_{3.0}Cu_{0.5}$) may be used as the solder.

The barrier layers 40 may cover the second surfaces 10b of the UBM layer 10, respectively.

The barrier layers 40 may minimize a level of wettability thereof with respect to the solder bump 30, and may substantially prevent the IMC 20 and the solder bump 30 from diffusing or overflowing into the second surfaces 10b. Such reduction or substantial prevention may be achieved by providing a material of the barrier layer 40 to have a sufficiently low level of wettability with respect to the IMC 20 and the solder bump 30. Accordingly, the IMC 20 or the solder bump 30 may not be formed on the barrier layer 40.

The barrier layer 40 may be an oxide layer containing at least one element of the UBM layer 10. For example, the barrier layer 40 may be an oxide layer containing at least one of Ni and Cu.

The barrier layers 40 may be formed by oxidizing the second surfaces 10b of the UBM layer 10, and for example, may be formed by oxidizing the second surfaces 10b of the UBM layer 10 by performing a thermal oxidation process or a plasma oxidation process.

The passivation layer 50 may be disposed adjacently to the UBM layer 10 on the electrode A. For example, the passivation layer 50 may be formed of or include an oxide or a nitride such as silicon dioxide ($SiO_2$) or silicon nitride (SiN).

The passivation layer 50 may be disposed so as not to be in contact with the UBM layer 10 through being spaced apart therefrom, on the electrode A. In addition, the passivation layer 50 may have a thin film structure, and may have a thickness lower than a thickness of the UBM layer 10. That is, the first surface 10a of the UBM layer 10 may be disposed to be higher than a top surface of the passivation layer 50, based on the surface of the electrode A.

Although the example embodiment illustrates the passivation layer 50 being disposed adjacently to the UBM layer 10, the disposition of the passivation layer 50 is not limited thereto. The passivation layer 50 may be selectively provided. Accordingly, in example embodiments, the passivation layer 50 may be omitted.

Hereinafter, a method of manufacturing an interconnection bump of a semiconductor device according to an example embodiment will be described with reference to FIGS. 3 through 11. FIGS. 3 through 11 are views schematically illustrating sequential operations in a method of manufacturing an interconnection bump of a semiconductor device according to an example embodiment.

Figure 3:
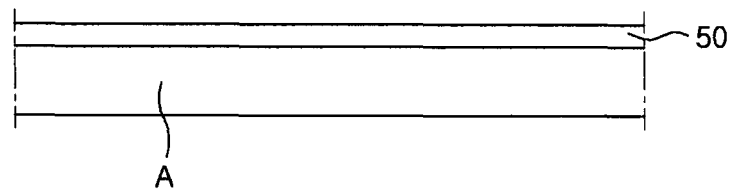
FIGS. 3 through 11 are views schematically illustrating sequential operations in a method of manufacturing an interconnection bump of a semiconductor device according to at least one example embodiment.

FIG. 3 schematically illustrates an operation of forming the passivation layer 50 on the electrode A of the semiconductor device.

For example, the passivation layer 50 may be formed of or include an oxide or a nitride such as $SiO_2$ or SiN, and may have a thin film structure in which a thickness thereof is in a range of about 10 angstroms (Å) to 20,000 Å. Although the passivation layer 50 may substantially entirely cover a surface of the electrode A, the formation of the passivation layer 50 is not limited thereto.

Figure 4:
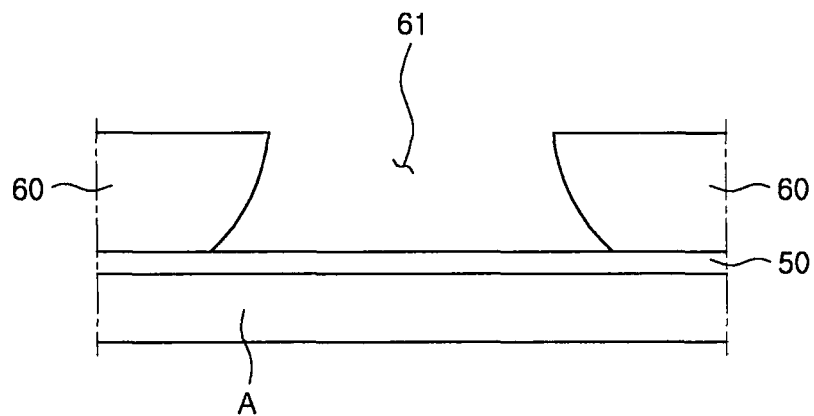

FIG. 4 schematically illustrates an operation of forming a photoresist pattern 60 in which a solder bump forming area is open, on the passivation layer 50.

The photoresist pattern 60 may be provided with an opening 61 partially exposing the passivation layer 50 to the solder bump forming area. Here, the solder bump forming area may be defined as an area occupied by the solder bump and an area adjacent thereto.

The photoresist pattern 60 may have an overhang structure in which lateral surfaces of the opening 61 are downwardly recessed towards the passivation layer 50 such that an inner area of the opening 61 is increased downwardly. That is, the opening 61 may have a structure in which an area of the opening 61 in a top surface of the photoresist pattern 60 is increased downwardly towards a lower surface of the photoresist pattern 60 in contact with the passivation layer 50.

Figure 5:
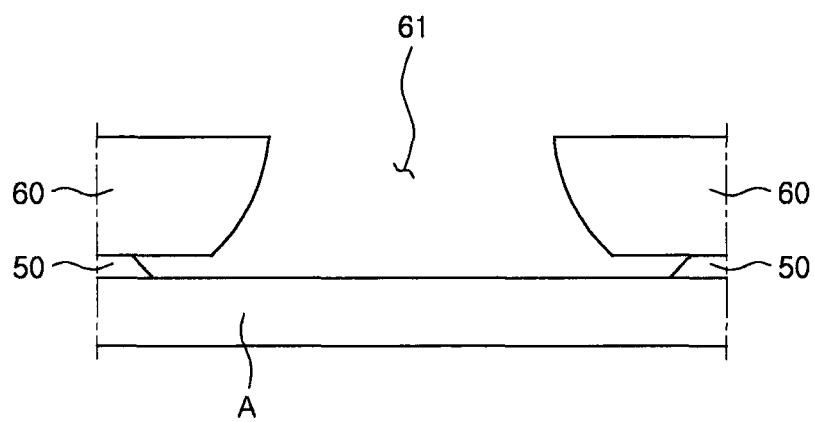

FIG. 5 schematically illustrates an operation of etching a portion of the passivation layer 50 exposed through the opening 61 of the photoresist pattern 60 and removing the portion of the passivation layer 50. Through this, the solder bump forming area of the electrode A may be exposed.

For example, the passivation layer 50 may be removed by performing a wet etching process. In this instance, the portion of the passivation layer 50 exposed through the opening 61 and portions of the passivation layer 50 below the photoresist pattern 60 may be removed.

Figure 6:
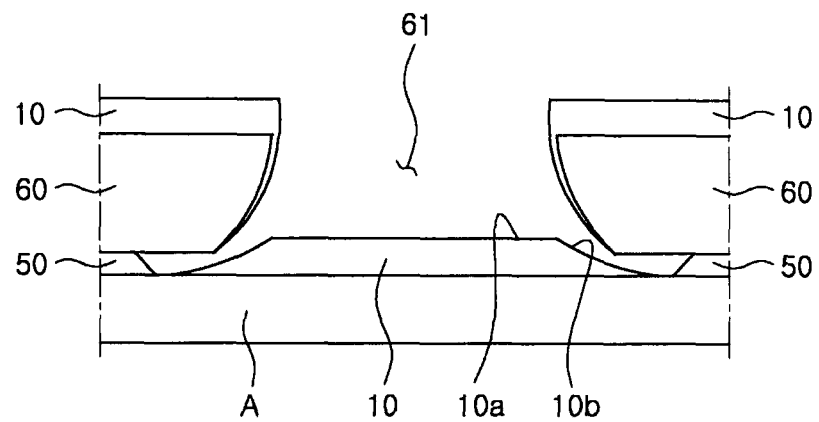

FIG. 6 schematically illustrates an operation of forming the UBM layer in the solder bump forming area of the electrode A.

The UBM layer 10 may be disposed on the electrode A exposed through the opening 61, and may have the first surface 10a disposed opposite to a surface of the electrode A and the second surfaces 10b extending from the edges of the first surface 10a, respectively, to be connected to the electrode A.

The first surface 10a may have an overall flat structure, and may define the top surface of the UBM layer 10. The second surfaces 10b may be slightly inclined towards the electrode A from the first surface 10a, and may define the lateral surfaces of the UBM layer 10.

For example, the UBM layer 10 may be formed via a sputtering process. Accordingly, a material forming the UBM layer 10 may be deposited on the surface of the electrode A through the opening 61 of the photoresist pattern 60 to form a film provided as the UBM layer 10. In detail, since the opening 61 has the overhang structure, the material may be deposited while extending onto a portion of area facing a portion of a lower surface of the photoresist pattern 60 to form the UBM layer 10 having a protruding structure in a slightly inclined manner.

In addition, the material forming the UBM layer 10 may be deposited on the top surface of the photoresist pattern 60 and the lateral surfaces of the opening 61 of the photoresist pattern 60 to form the film provided as the UBM layer 10.

Figure 7:
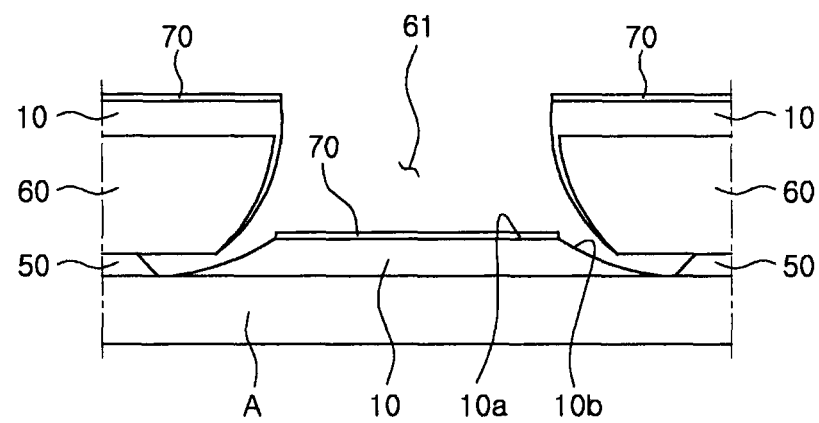

FIG. 7 schematically illustrates an operation of forming an anti-oxidant layer 70 on the first surface 10a, that is, the top surface of the UBM layer 10.

The anti-oxidant layer 70 may be formed of or include gold (Au) or an Au alloy. For example, the anti-oxidant layer 70 may cover the first surface 10a of the UBM layer 10 and the photoresist pattern 60 by performing a film-forming process such as a sputtering process or a plating process.

Figure 8:
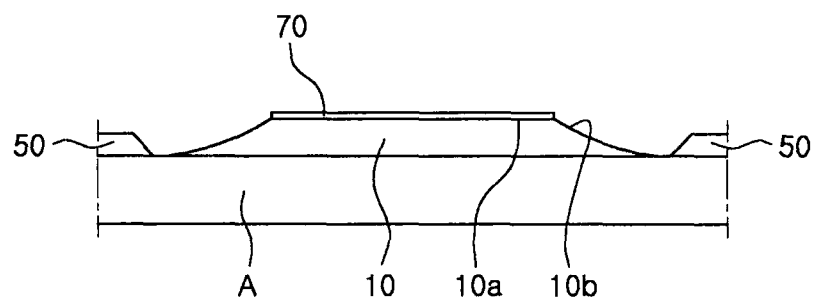

FIG. 8 schematically illustrates an operation of removing the photoresist pattern 60 from the passivation layer 50. For example, the photoresist pattern 60 may be removed by performing a lift-off process.

Figure 9:
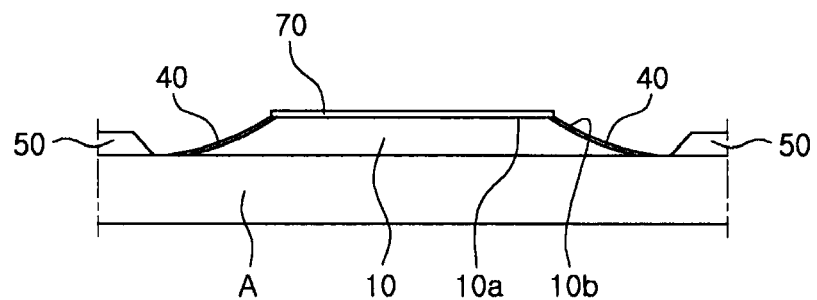

FIG. 9 schematically illustrates an operation of forming the barrier layers 40 on the second surfaces 10b of the UBM layer 10, respectively.

For example, the barrier layers 40 may be formed by oxidizing surfaces of the UBM layer 10, respectively, by injecting oxygen thereinto and performing a thermal oxidation process or a plasma oxidation process thereon. In this instance, since the first surface 10a, that is, the top surface of the UBM layer 10, is protected by the anti-oxidant layer 70, the second surfaces 10b, that is, the lateral surfaces of the UBM layer 10 exposed externally, may be oxidized to form the barrier layers 40 covering the second surfaces 10b, respectively.

The barrier layer 40 may be an oxide layer containing at least one of Ni and Cu formed by oxidizing the second surface 10b of the UBM layer 10. For example, the barrier layer 40 may include a NiO thin film or a CuO thin film.

Figure 10:
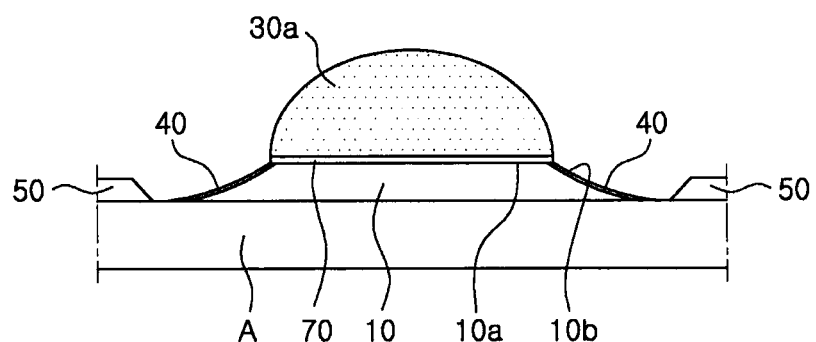
Figure 11:
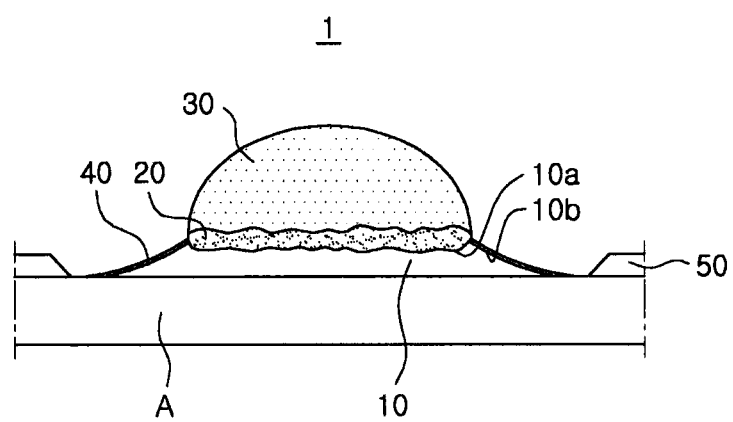

FIGS. 10 and 11 schematically illustrate operations of forming the solder bump 30 on the UBM layer 10. The solder bump 30 may be formed by forming a solder 30a on the UBM layer 10 and reflowing the solder 30a.

As illustrated in FIG. 10, the solder 30a may be formed on the anti-oxidant layer 70 covering the top surface of the UBM layer 10. For example, the solder 30a may be formed via a screen printing process.

As illustrated in FIG. 11, the IMC 20 may be formed between the solder bump 30 and the UBM layer 10 by reflowing the solder 30a. The solder bump 30 may be formed on the UBM layer 10 with the IMC 20 therebetween.

The anti-oxidant layer 70 may flow into the solder bump 30 during the reflow process to form an element of the solder bump 30.

The IMC 20 may form a Sn—Ni binary alloy obtained through melting a portion of the UBM layer 10 and a portion of the solder 30a. In this instance, diffusion of the solder bump 30 including the IMC 20 into the lateral surfaces of the UBM layer 10, that is, the second surfaces 10b, may be reduced or substantially prevented. Accordingly, the solder bump 30 including the IMC 20 may only be formed on the top surface of the UBM layer 10.

Hereinafter, a method of manufacturing an interconnection bump of a semiconductor device according to another example embodiment may be described with reference to FIGS. 12 through 17 along with FIGS. 3 through 5. FIGS. 12 through 17 are views schematically illustrating sequential operations in a method of manufacturing an interconnection bump of a semiconductor device according to another example embodiment.

Since a description of the operations of forming the passivation layer 50 on the electrode A of the semiconductor device, forming the photoresist pattern 60 in which the solder bump forming area is open, on the passivation layer 50, and partially etching the passivation layer 50 and exposing the solder bump forming area of the electrode A is disclosed in FIGS. 3 through 5, a repeated description thereof will be omitted. Hereinafter, as illustrated in FIG. 5, a description of conducting the method of manufacturing the interconnection bump in a state in which the solder bump forming area is open will be provided.

Figure 12:
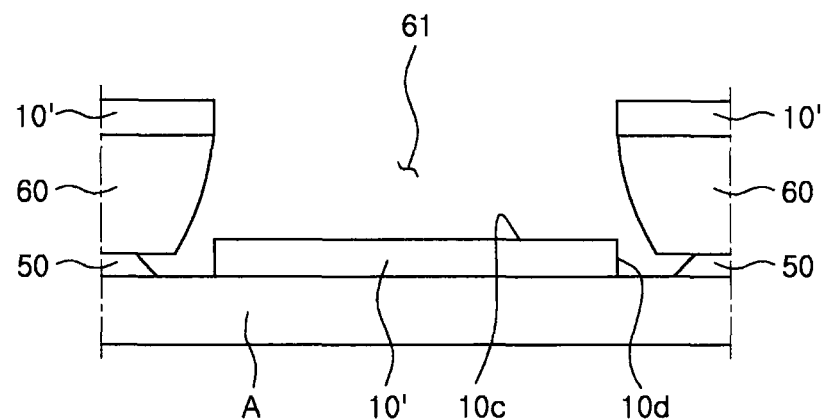
FIGS. 12 through 17 are views schematically illustrating sequential operations in a method of manufacturing an interconnection bump of a semiconductor device according to another example embodiment.

FIG. 12 schematically illustrates an operation of forming the UBM layer 10' in the solder bump forming area of the electrode A.

The UBM layer 10' may be disposed on the electrode A exposed through the opening 61, and may have the first surface 10c disposed opposite to the surface of the electrode A and the second surfaces 10d extending from edges of the first surface 10c to be connected to the electrode A.

The first surface 10c may have an overall flat structure, and may define a top surface of the UBM layer 10'. The second surfaces 10d may have a structure that is substantially perpendicular to the surface of the electrode A, and may define lateral surfaces of the UBM layer 10'.

For example, the UBM layer 10' may be formed via an e-beam deposition process. Alternatively, the UBM layer 10' may be formed via a plating process, and a material forming the UBM layer 10' may be deposited to have rectilinear characteristics or may be formed via a deposition process to have a low level of fluidity on a deposition surface, as compared to the example embodiment described above with reference to FIG. 6. Accordingly, in a manner dissimilar to that of the UBM layer 10 according to the example embodiment of FIG. 6, the UBM layer 10' according to the example embodiment may have a structure or a longitudinal direction that is substantially perpendicular to the surface of the electrode A.

Figure 13:
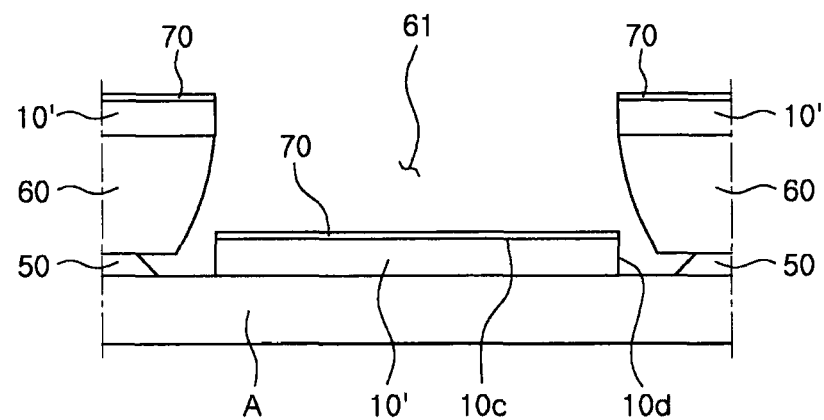

FIG. 13 schematically illustrates an operation of forming the anti-oxidant layer 70 on the first surface 10c, that is, the top surface of the UBM layer 10'.

The anti-oxidant layer 70 may be formed of or include Au or an Au alloy. For example, the anti-oxidant layer 70 may cover the first surface 10c of the UBM layer 10' and the photoresist pattern 60 by performing a film-forming process such as a sputtering process or a plating process.

Figure 14:
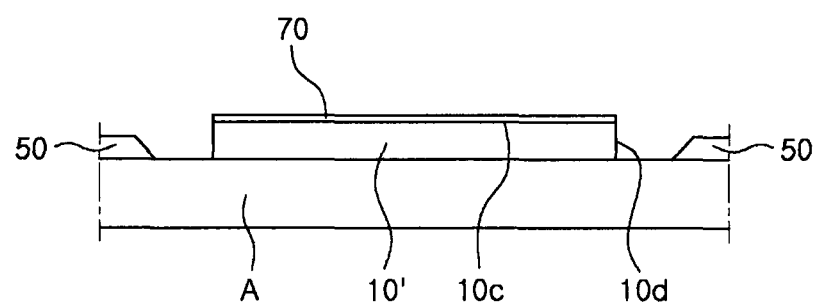

FIG. 14 schematically illustrates an operation of removing the photoresist pattern 60 from the passivation layer 50. For example, the photoresist pattern 60 may be removed by performing a lift-off process.

Figure 15:
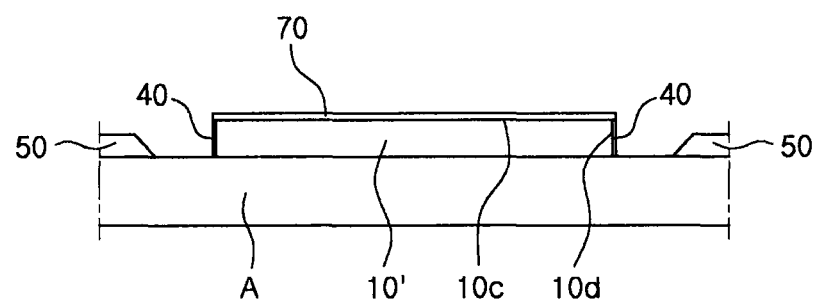

FIG. 15 schematically illustrates an operation of forming the barrier layers 40 on the second surfaces 10d of the UBM layer 10', respectively.

For example, the barrier layers 40 may be formed by oxidizing surfaces of the UBM layer 10' by injecting oxygen thereinto and performing a thermal oxidation process or a plasma oxidation process. In this instance, the first surface 10c, that is, the top surface of the UBM layer 10', may be protected by the anti-oxidant layer 70, and thus the second surfaces 10d, that is, the lateral surfaces of the UBM layer 10' exposed externally, may be oxidized to form the barrier layers 40 covering the second surfaces 10d, respectively.

The barrier layer 40 may be an oxide layer containing at least one of Ni and Cu formed by oxidizing the second surface 10d of the UBM layer 10'. For example, the barrier layer 40 may include a NiO thin film or a CuO thin film.

Figure 16:
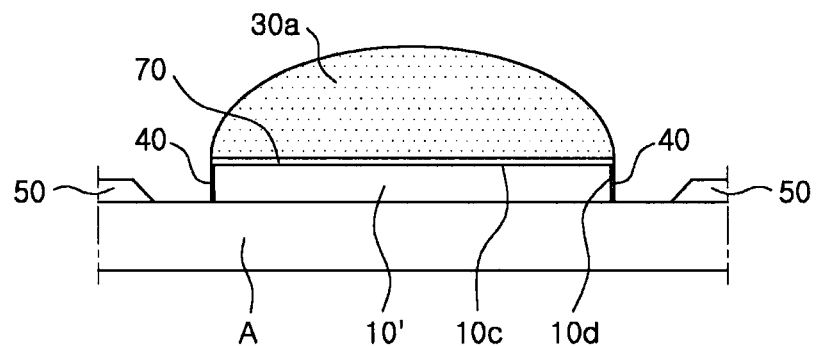
Figure 17:
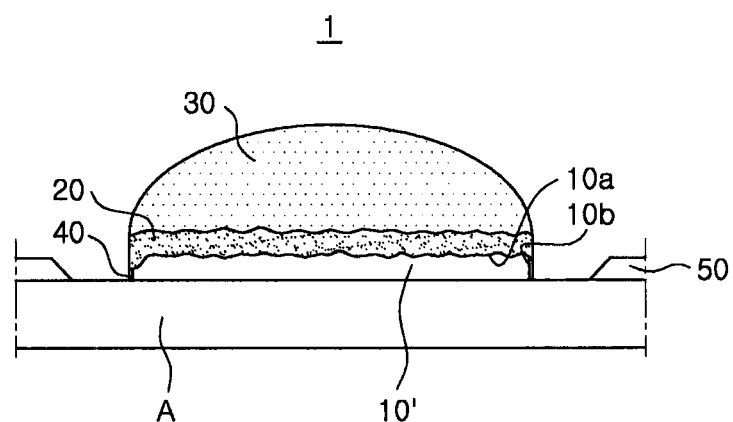

FIGS. 16 and 17 schematically illustrate operations of forming the solder bump 30 on the UBM layer 10'. The solder bump 30 may be formed by forming the solder 30a on the UBM layer 10' and reflowing the solder 30a.

As illustrated in FIG. 16, the solder 30a may be formed on the anti-oxidant layer 70 covering the top surface of the UBM layer 10'. For example, the solder 30a may be formed via a screen printing process.

As illustrated in FIG. 17, the IMC 20 may be formed between the solder bump 30 and the UBM layer 10' by reflowing the solder 30a. The solder bump 30 may be formed on the UBM layer 10' with the IMC 20 therebetween.

Figure 18:
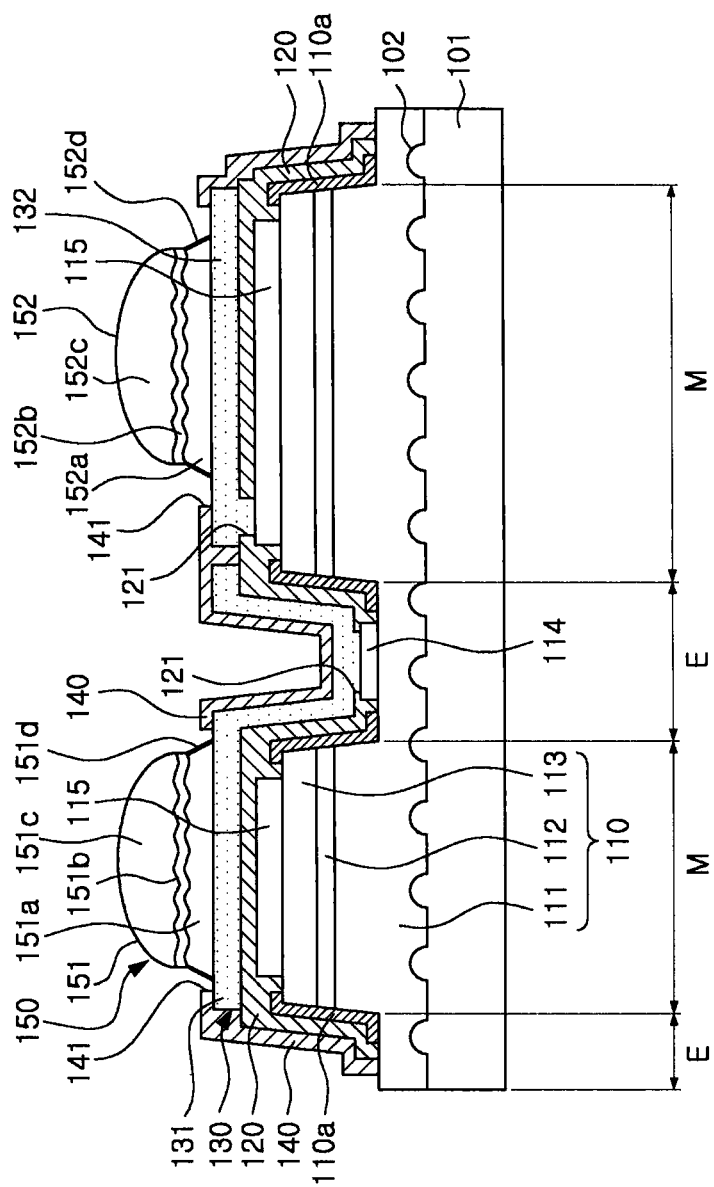
FIG. 18 is a cross-sectional view schematically illustrating a semiconductor device according to an example embodiment.

Hereinafter, a semiconductor device provided with an interconnection bump according to an example embodiment will be described with reference to FIG. 18. FIG. 18 is a cross-sectional view schematically illustrating a semiconductor device according to an example embodiment.

For example, the semiconductor device may be a light emitting diode (LED) chip emitting light having a desired, or alternatively predetermined wavelength. In addition, the semiconductor LED chip may be a logic semiconductor chip or a memory semiconductor chip. The logic semiconductor chip may be a micro-processor, for example, a central processing unit (CPU), a controller, or an application specific integrated circuit (ASIC). Further, the memory semiconductor chip may be a volatile memory such as a dynamic random access memory (DRAM) or a static random access memory (SRAM), or a non-volatile memory such as a flash memory. In the example embodiment, a case in which the semiconductor device is an LED chip will be described.

Referring to FIG. 18, a semiconductor device 100 according to an example embodiment may include a light emitting structure 110, a first insulating layer 120, an electrode layer 130, a second insulating layer 140, and an interconnection bump 150.

The light emitting structure 110 may have a structure in which a plurality of semiconductor layers are stacked, and may include a first conductivity-type semiconductor layer 111, an active layer 112, and a second conductivity-type semiconductor layer 113 which are sequentially stacked on a substrate 101.

The substrate 101 may have a top surface extending in x and y directions. The substrate 101 may be provided as a semiconductor growth substrate, and may use insulating, conductive, and semiconductor materials, such as sapphire, silicon (Si), silicon carbide (SiC), magnesium aluminate ($MgAl_2O_4$), magnesium oxide (MgO), lithium aluminate ($LiAlO_2$), lithium gallium oxide ($LiGaO_2$), GaN, or the like.

A plurality of uneven, concave or patterned structures 102 may be formed on the top surface of the substrate 101, that is, a surface on which the semiconductor layers are grown. The uneven, concave or patterned structure 102 may enhance crystallinity of the semiconductor layers and light emission efficiency. In the example embodiment, the substrate 101 is exemplified as having a dome shape; however, the shape of the uneven, concave or patterned structure 102 is not limited thereto. For example, the uneven, concave or patterned structure 102 may have various shapes such as a rectangular shape or a triangular shape. In addition, the uneven, concave or patterned structure 102 may be selectively formed and provided; therefore, the structure 102 may also be omitted.

On the other hand, according to example embodiments, the substrate 101 may be subsequently removed. That is, the substrate 101 may be provided as a growth substrate for growing the first conductivity-type semiconductor layer 111, the active layer 112, and the second conductivity-type semiconductor layer 113, and may be removed by a separation process. The substrate 101 may be separated from the semiconductor layer by a laser lift-off (LLO) process, a chemical lift-off (CLO) process, or the like.

The first conductivity-type semiconductor layer 111 stacked on the substrate 101 may be formed of or include a semiconductor doped with n-type impurities, and may be an n-type nitride semiconductor layer. The second conductivity-type semiconductor layer 113 may be formed of or include a semiconductor doped with p-type impurities, and may be a p-type nitride semiconductor layer. However, according to example embodiments, positions of the first and second conductivity-type semiconductor layer 111 and 113 may be interchanged so as to be stacked. For example, the first and second conductivity-type semiconductor layers 111 and 113 may have a composition of $Al_xIn_yGa_{1-x-y}N$, wherein $0 \leq x \leq 1$, $0 \leq y \leq 1$, $0 \leq x+y \leq 1$, for example, a material such as gallium nitride (GaN), aluminum gallium nitride (AlGaN), indium gallium nitride (InGaN), or aluminum indium gallium nitride AlInGaN.

The active layer 112 disposed between the first and second conductivity-type semiconductor layers 111 and 113 may emit light having a desired, or alternatively predetermined level of energy through recombination of electrons and holes. The active layer 112 may include a material having an energy bandgap smaller than the energy bandgaps of the first and second conductivity-type semiconductor layers 111 and 113. For example, in a case in which the first and second conductivity-type semiconductor layers 111 and 113 are a GaN-based compound semiconductor, the active layer 112 may include an InGaN-based compound semiconductor having an energy bandgap smaller than an energy bandgap of GaN. In addition, the active layer 112 may have a multi-quantum well (MQW) structure in which a plurality of quantum wells and a plurality of quantum barriers are stacked in an alternating manner, for example, an InGaN/GaN structure. However, the structure of the active layer 112 is not limited thereto, and the active layer 112 may have a single quantum well (SQW) structure in which a single quantum well and a single quantum barrier are stacked.

The light emitting structure 110 may include an etched portion E in which the second conductivity-type semiconductor layer 113, the active layer 112, and portions of the first conductivity-type semiconductor layer 111 are etched, respectively, and a plurality of mesa portions M partially demarcated by the etched portion E.

A first contact electrode 114 may be disposed on a top surface of the first conductivity-type semiconductor layer 111 exposed to the etched portion E to be connected to the first conductivity-type semiconductor layer 111, and a second contact electrode 115 may be disposed on a top surface of the plurality of mesa portions M to be connected to the second conductivity-type semiconductor layer 113.

On the other hand, to cover the active layer 112 exposed to the etched portion E, a passivation layer 110a formed of or including an insulating material may be provided on a lateral surface of the mesa portion M. However, the passivation layer 110a may be selectively provided, and may be omitted according to example embodiments.

The first insulating layer 120 may be provided on the light emitting structure 110 to entirely cover the light emitting structure 110. The first insulating layer 120 may be basically formed of or include a material having insulating characteristics, and may be formed of or include inorganic or organic materials. For example, the first insulating layer 120 may be formed of or include an epoxy-based insulating resin. In addition, the first insulating layer 120 may include a silicon oxide or silicon nitride, for example, $SiO_2$, SiN, SiOxNy, $TiO_2$, $Si_3N_4$, $Al_2O_3$, TiN, AlN, $ZrO_2$, TiAlN, or TiSiN.

The first insulating layer 120 may be provided with a plurality of first openings 121 disposed on the first conductivity-type semiconductor layer 111 exposed to the etched portion E, and the second conductivity-type semiconductor layer 113, respectively. In detail, the first opening 121 may have a structure in which the first contact electrode 114 and the second contact electrode 115 are partially exposed on the first and second conductivity-type semiconductor layers 111 and 113, respectively.

The electrode layer 130 may be provided on the first insulating layer 120, and may be electrically connected to at least one of, or each of, the first and second conductivity-type semiconductor layers 111 and 113.

The electrode layer 130 may be insulated from the first and second conductivity-type semiconductor layers 111 and 113 by the first insulating layer 120 entirely covering the top surface of the light emitting structure 110. In addition, the electrode layer 130 may be connected to the first and second conductivity-type semiconductor layers 111 and 113 through being connected to the first and second contact electrodes 114 and 115 exposed externally through the first openings 121.

The electrical connection between the first and second conductivity-type semiconductor layers 111 and 113 and the electrode layer 130 may be adjusted in various manners by the first openings 121 provided in the first insulating layer 120. For example, the electrical connection between the first and second conductivity-type semiconductor layers 111 and 113 and the electrode layer 130 may be adjusted in various manners based on the number and a disposition of the first openings 121.

The electrode layer 130 may be provided in at least a pair for electrical insulation between the first and second conductivity-type semiconductor layers 111 and 113. That is, a first electrode layer 131 may be electrically connected to the first conductivity-type semiconductor layer 111, a second electrode layer 132 may be electrically connected to the second conductivity-type semiconductor layer 113, and the first and second electrode layers 131 and 132 may be separated from one another to be electrically insulated.

The electrode layer 130 may be formed of or include a material including at least one of a material such as Au, W, Pt, Si, Ir, Ag, Cu, Ni, Ti, Cr, and an alloy thereof.

The second insulating layer 140 may be provided on the electrode layer 130, and may entirely cover the electrode layer 130 for protection thereof. The second insulating layer 140 may be provided with a second opening 141 partially exposing the electrode layer 130.

The second opening 141 may include a plurality of openings to partially expose the first and second electrode layers 131 and 132, respectively. In this instance, the second opening 141 may be disposed so as not to overlap the first opening 121 of the first insulating layer 120. That is, the second opening 141 may not be vertically disposed on an upper portion of the first opening 121.

The second insulating layer 140 may be formed of or include a material the same as that of the first insulating layer 120.

The interconnection bump 150 may include a first bump 151 and a second bump 152, and the first and second bumps 151 and 152 may be provided on the first and second electrode layers 131 and 132, which are partially exposed through the second openings 141, respectively. The first and second bumps 151 and 152 may be electrically connected to the first and second conductivity-type semiconductor layers 111 and 113 through electrode layer 130. The first and second bumps 151 and 152 may be disposed in a single direction on the light emitting structure 110.

At least one of the first and second bumps 151 and 152 may include UBM layers 151a and 152a provided on the first and second electrode layers 131 and 132, IMCs 151b and 152b, solder bumps 151c and 152c, and barrier layers 151d and 152d.

The first and second bumps 151 and 152 may include a single bump or a plurality of bumps. The number and a disposition structure of the first and second bumps 151 and 152 may be adjusted by the second openings 141.

The aforementioned interconnection bump 150 may have a basic configuration and a structure substantially identical to those of the interconnection bump 1 disclosed in FIGS. 1 and 2, and thus, a detailed description thereof will be omitted.

Figure 19:
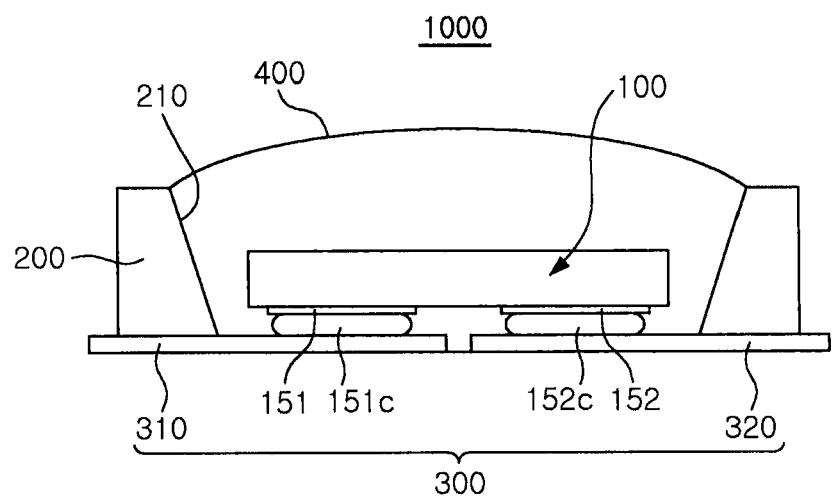
FIGS. 19 and 20 are cross-sectional views schematically illustrating examples of applying a semiconductor device according to an example embodiment to a package.
Figure 20:
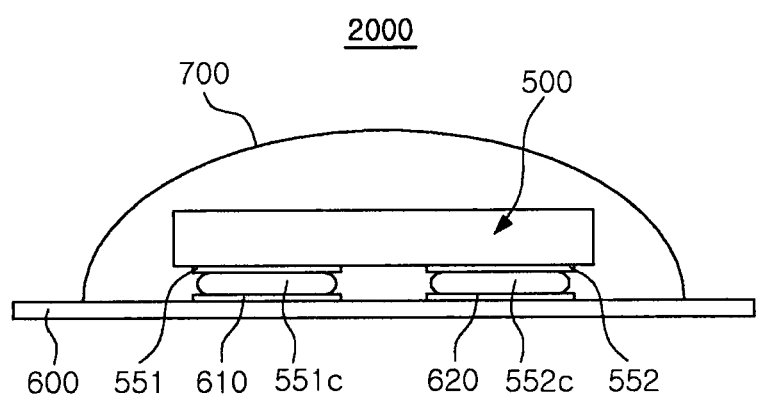

FIGS. 19 and 20 are cross-sectional views schematically illustrating examples of applying a semiconductor device according to an example embodiment to a package.

Referring to FIG. 19, a semiconductor device package 1000 may include a semiconductor device 100, a package main body 200, a pair of lead frames 300, and an encapsulating portion 400. Here, the semiconductor device 100 may be the semiconductor device 100 of FIG. 18, and a description thereof will be omitted.

The semiconductor device 100 may be mounted on the lead frames 300, and may be electrically connected to the lead frames 300 through solder bumps.

The pair of lead frames 300 may include a first lead frame 310 and a second lead frame 320. Referring to FIG. 19, the first and second bumps 151 and 152 of the semiconductor device 100 may be connected to the first and second lead frames 310 and 320 through the solder bumps 151c and 152c interposed between the first and second bumps 151 and 152 and the pair of lead frames 300, respectively.

The solder bumps 151c and 152c may be bonded to the first and second lead frames 310 and 320 by a reflow process. In this instance, the solder bump 151c including the IMC 151b may not be diffused into lateral surfaces of the UBM layer 151a by the barrier layers 151d, and the solder bump 152c including the IMC 152b may not be diffused into lateral surfaces of the UBM layer 152a by the barrier layers 152d, as referred in FIG. 18.

The package main body 200 may be provided with a reflective cup 210 to enhance light reflection efficiency and light extraction efficiency. In the reflective cup 210, an encapsulating portion 400 formed of or including a light transmissive material may encapsulate the semiconductor device 100.

Referring to FIG. 20, a semiconductor device package 200 may include a semiconductor device 500, a mounting substrate 600, and an encapsulating portion 700. Here, the semiconductor device 500 may be the semiconductor device 100 of FIG. 18, and thus a description thereof will be omitted.

The semiconductor device 500 may be mounted on the mounting substrate 600 to be electrically connected to first and second circuit patterns 610 and 620.

Referring to FIG. 20, first and second bumps 551 and 552 of the semiconductor device 500 may be connected to the first and second circuit patterns 610 and 620 through solder bumps 551c and 552c interposed between the first and second bumps 551 and 552 and the first and second circuit patterns 610 and 620, respectively.

The semiconductor device 500 may be encapsulated by the encapsulating portion 700. Through this, a package structure in a chip on board (COB) type may be provided.

The mounting substrate 600 may be provided as a substrate such as a printed circuit board (PCB), a metal core printed circuit board (MCPCB), a multilayer printed circuit board (MPCB), or a flexible printed circuit board (FPCB), and a structure of the mounting substrate 600 may be applied in various manners.

On the other hand, wavelength converting materials may be contained in the encapsulating portions 400 and 700. For example, the wavelength converting material may contain at least one type of phosphor emitting light through being excited by light generated by the semiconductor devices 100 and 500 so as to emit light having a wavelength different from the light generated by the semiconductor devices 100 and 500. Accordingly, the emission of light may be controlled to have different colors including white light.

For example, in a case in which the semiconductor devices 100 and 500 emit blue light, white light may be emitted through a combination thereof with yellow, green, and red and/or orange phosphors. Also, the semiconductor devices 100 and 500 may be configured to include at least one LED chip emitting purple, blue, green, red, or infrared (IR) light. For example, the semiconductor device packages 1000 and 2000 may adjust a color rendering index (CRI) in a range from a level of light with a CRI of 40 to a level of light with a CRI of 100, and may generate various types of white light having a color temperature in a range of about 2,000K to 20,000K. Also, the color may be adjusted by generating visible purple, blue, green, red, orange light, or IR light, corresponding to a surrounding atmosphere or desired mood, as necessary. Also, light from within a desired, or alternatively predetermined wavelength known to stimulate plant growth may be generated.

Figure 21:
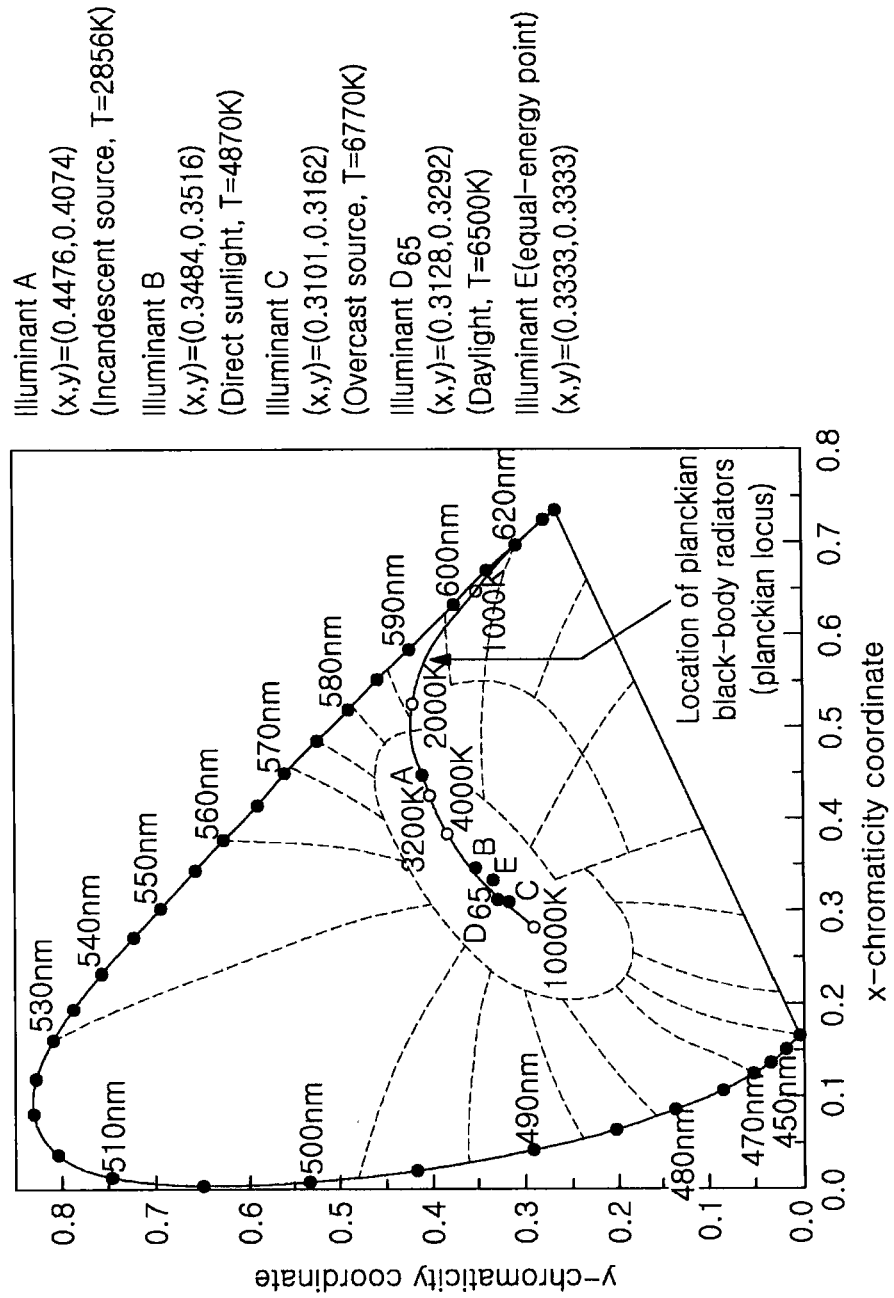
FIG. 21 is a CIE 1931 color space diagram illustrating a wavelength converting material applicable to an example embodiment.

White light generated by combining yellow, green, and red phosphors with a blue LED and/or combining at least one of a green LED and a red LED therewith may have two or more peak wavelengths, and may be positioned in a segment linking (x, y) coordinates of (0.4476, 0.4074), (0.3484, 0.3516), (0.3101, 0.3162), (0.3128, 0.3292), and (0.3333, 0.3333) in the CIE 1931 color space illustrated in FIG. 21. Alternatively, the white light may be positioned in an area surrounded by the segment and a black body radiation spectrum. The color temperature of the white light may be in a range of 2,000K to 20,000K.

Phosphors applicable to the example embodiment may have a composition and a color as follows.

Oxide-based phosphors: yellow and green $Y_3Al_5O_{12}$:Ce, $Tb_3Al_5O_{12}$:Ce, $Lu_3Al_5O_{12}$:Ce Silicate-based phosphors: yellow and green $(Ba,Sr)_2SiO_4$:Eu, yellow and orange $(Ba,Sr)_3SiO_5$:Ce Nitride-based phosphors: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_4-x(Eu_zM_{1-z})xSi_{12}-yAl_yO_3+x+yN_{18}-x-y$ (0.5≤x≤3, 0<z<0.3, 0<y≤4), where Ln denotes an element selected from the group consisting of or including IIIA group elements and rare earth elements, and M denotes at least one element selected from the group consisting of or including calcium (Ca), barium (Ba), strontium (Sr), and magnesium (Mg).

Fluoride-based phosphors: KSF red $K_2SiF_6$:$Mn^{4+}$, $K_2TiF_6$:$Mn^{4+}$, $NaYF_4$:$Mn^{4+}$, $NaGdF_4$:$Mn^{4+}$.

In general, phosphor compositions need to conform to Stoichiometric requirements, and each element may be substituted with a different element within the same group in the periodic table of elements. For example, Sr may be substituted with Ba, Ca, Mg, or the like, in the alkaline earth metal group II while yttrium (Y) may be substituted with terbium (Tb), lutetium (Lu), scandium (Sc), gadolinium (Gd), or the like, in the lanthanide group. Also, europium (Eu), or the like, an activator, may be substituted with cerium (Ce), Tb, praseodymium (Pr), erbium (Er), ytterbium (Yb), or the like, based on a desired energy level. In addition, the activator may be used alone, or a co-activator, or the like, may be further included to change characteristics.

Further, a material such as a QD may be used as a phosphor substitute material, or the phosphor and the QD may be used in combination or alone.

The QD may have a structure including a core such as cadmium selenide (CdSe) and indium phosphide (InP) having a diameter of about 3 to 10 nanometers (nm), a shell such as zinc sulfide (ZnS) and zinc selenide (ZnSe) having a thickness of about 0.5 to 2 nm, and a ligand for stabilizing the core and the shell, and may provide various colors based on the size thereof.

Figure 22:
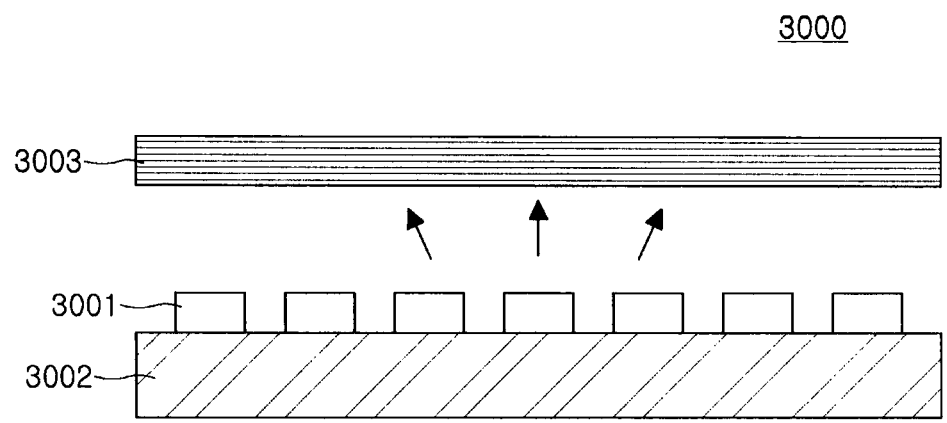
FIGS. 22 and 23 are cross-sectional views illustrating examples of backlight units using a semiconductor device according to an example embodiment.
Figure 23:
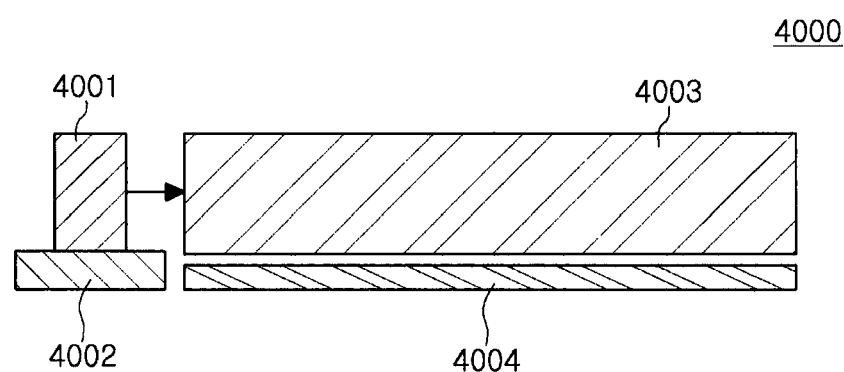

FIGS. 22 and 23 are cross-sectional views illustrating examples of backlight units using semiconductor devices according to example embodiments.

Referring to FIG. 22, a backlight unit 3000 may include a light source 3001 mounted on a substrate 3002, and at least one optical sheet 3003 disposed thereabove. As the light source 3001, the semiconductor device package having the structure described above with reference to FIGS. 19 and 20 or a same or similar structure thereto may be used, or a semiconductor device may be directly mounted on the substrate 3002 in a so-called COB type manner.

The light source 3001 in the back light unit 3000 illustrated in FIG. 22 may emit light upwardly in a direction in which a liquid crystal display (LCD) device is disposed. However, in a back light unit 4000 of another example illustrated in FIG. 23, alight source 4001 mounted on a substrate 4002 may emit light in a lateral direction such that the emitted light may be incident onto a light guiding panel 4003 to be converted into a form of a surface light source. Light, having passed through the light guiding panel 4003, may be dissipated upwardly, and a reflective layer 4004 may be disposed below the light guiding panel 4003 to improve light extraction efficiency.

Figure 24:
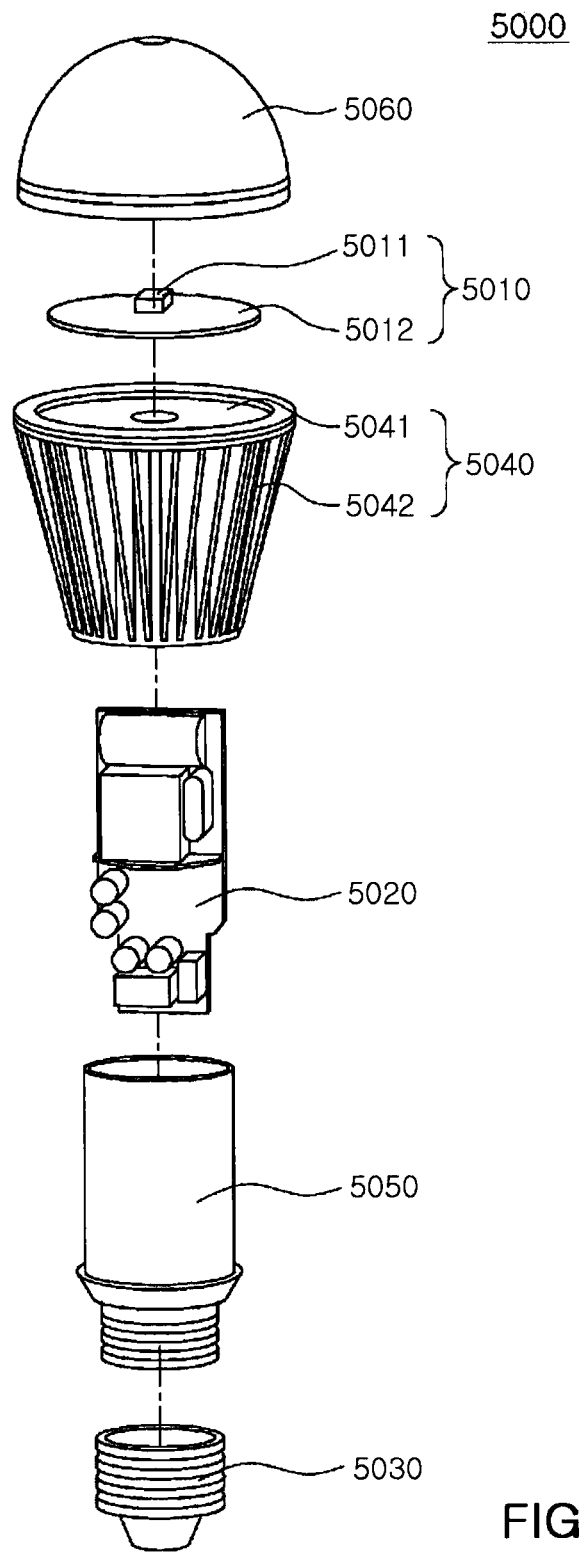
FIGS. 24 and 25 are exploded perspective views illustrating examples of lighting apparatuses using a semiconductor device according to an example embodiment.
Figure 25:
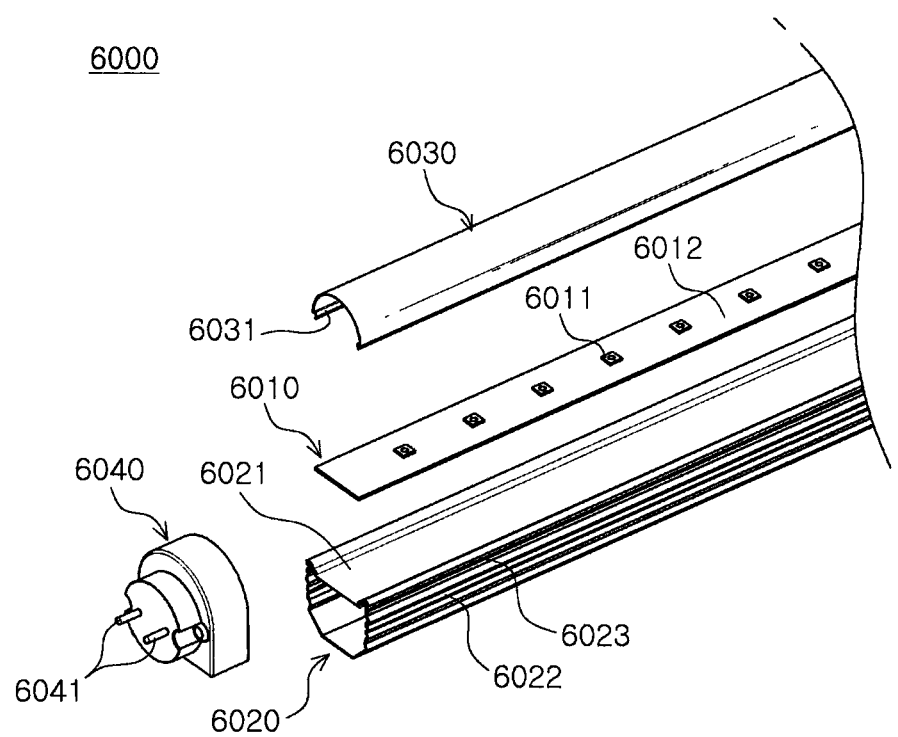

FIGS. 24 and 25 are exploded perspective views illustrating examples of lighting apparatuses using semiconductor devices according to example embodiments.

Referring to FIG. 24, a lighting apparatus 5000 is illustrated as a bulb-type lamp, and may include a light emitting module 5010, a driving unit 5020, and an external connection unit 5030. In addition, the lighting apparatus 5000 may further include an outer structure such as an external housing 5040, an internal housing 5050, and a cover unit 5060.

The light emitting module 5010 may include a semiconductor device 5011 having a structure identical to or similar to the semiconductor device 100 of FIG. 18 and a circuit substrate 5012 on which the semiconductor device 5011 is mounted. In the example embodiment, an example in which a single semiconductor device 5011 is mounted on the circuit substrate 5012 is exemplified; however, as necessary, a plurality of semiconductor devices may be mounted thereon. Further, the semiconductor device 5011 may not be mounted directly on the circuit substrate 5012, and may be mounted thereon subsequently to being manufactured in the package form illustrated in FIGS. 19 and 20.

The external housing 5040 may serve as a heat dissipation unit, and may include a heat dissipation plate 5041 indirect contact with the light emitting module 5010 to enhance heat dissipation effects, and heat dissipation fins 5042 surrounding a side surface of the external housing 5040. The cover unit 5060 may be mounted on the light emitting module 5010, and may have a convex lens shape. The driving unit 5020 may be installed in the internal housing 5050, and may be connected to the external connection unit 5030 such as a socket structure to be supplied with power externally. Also, the driving unit 5020 may convert power into an appropriate current source for driving the semiconductor device 5011 of the light emitting module 5010, and may provide the converted current source. For example, the driving unit 5020 may be configured of an alternating current-direct current (AC-DC) converter, or a rectifier circuit component.

Further, although not illustrated, the lighting apparatus 5000 may further include a communications module.

Referring to FIG. 25, a lighting apparatus 6000 may be illustrated as a bar-type lamp by way of example, and may include a light emitting module 6010, a body unit 6020, a cover unit 6030, an a terminal unit 6040.

The light emitting module 6010 may include a substrate 6012 and a plurality of semiconductor devices 6011 mounted on the substrate 6012. The semiconductor device 6011 may be the semiconductor device 100 of FIG. 18 or the semiconductor device packages 1000 and 2000 of FIGS. 19 and 20.

The light emitting module 6010 may be mounted on and fixed to one surface of the body unit 6020 by a recess 6021, and may externally dissipate heat generated from the light emitting module 6010. Accordingly, the body unit 6020 may include a heat sink as a type of a support structure, and may include a plurality of heat dissipating fins 6022 used for dissipating heat provided on both lateral surfaces of the body unit 6020 while protruding therefrom.

The cover unit 6030 may be fastened to a fastening groove 6023 of the body unit 6020, and may have a semicircular curved surface to allow light to be uniformly dissipated externally. A protrusion portion 6031 engaged with the fastening groove 6023 of the housing 6020 may be formed on a bottom surface of the cover unit 6030 in a length direction of the body unit 6020.

The terminal unit 6040 may be provided in an open end portion of the body unit 6020 in the length direction thereof, and may supply power to the light emitting module 6010. The terminal unit 6040 may include an outwardly protruding electrode pin 6041.

Figure 26:
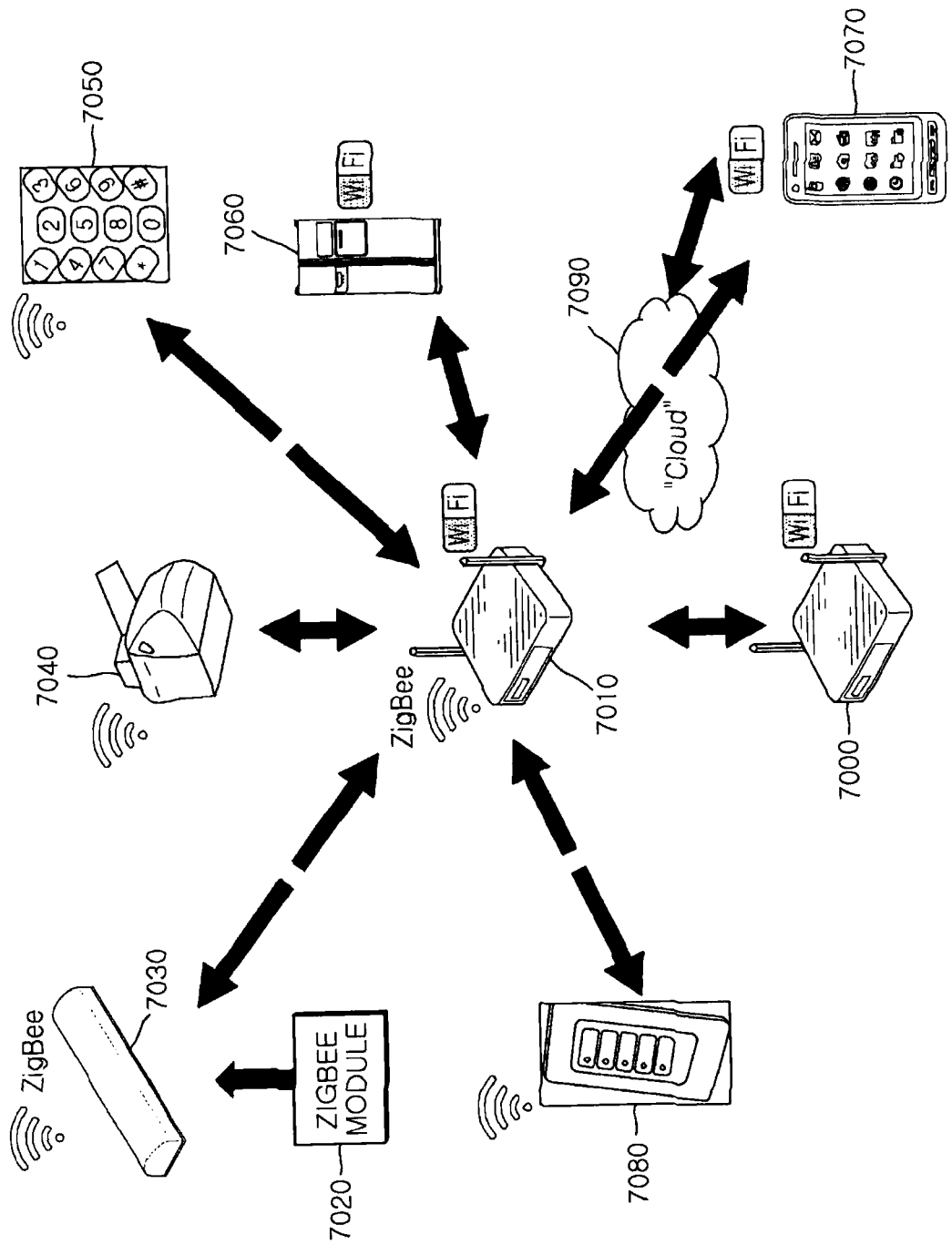
FIGS. 26 and 27 are views schematically illustrating home networks using a lighting system using a lighting apparatus according to an example embodiment.
Figure 27:
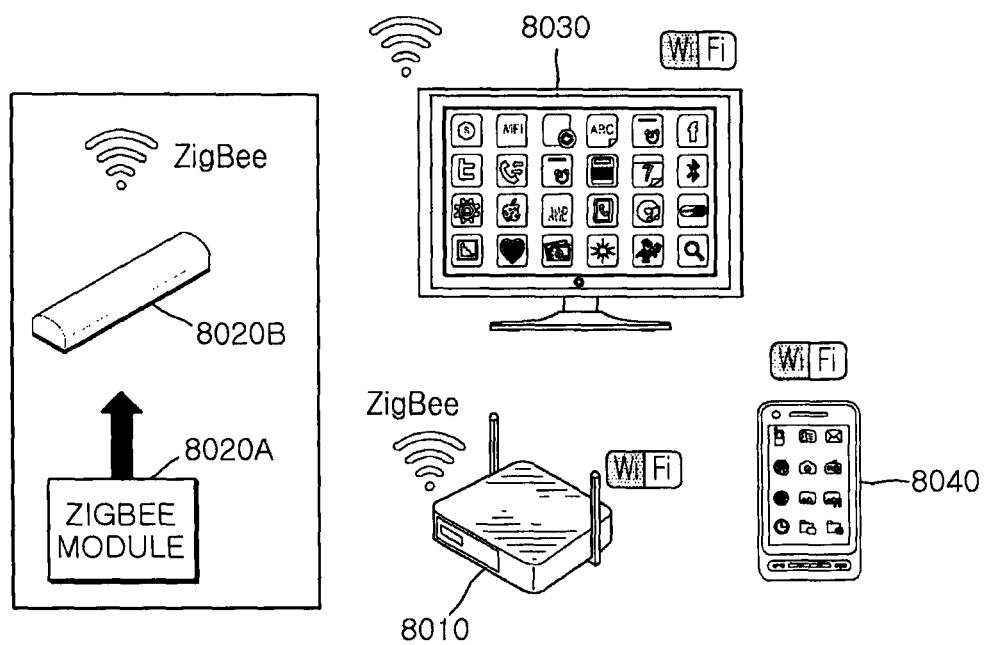

FIGS. 26 and 27 are views schematically illustrating home networks using lighting systems using a lighting apparatus according to an example embodiment.

As illustrated in FIG. 26, a home network may include a home wireless router 7000, a gateway hub 7010, a ZigBee module 7020, alighting apparatus 7030, a garage door lock 7040, a wireless door lock 7050, a home application 7060, a mobile phone 7070, switches installed on a wall 7080, and a cloud computing network 7090.

Wireless home communication, for example, ZigBee or wireless fidelity (Wi-Fi) may be used to automatically adjust a level of brightness of the lighting apparatus 7030 based on circumstances/conditions in interior spaces such as bedrooms, living rooms, a front door, storage rooms, or an operational status of electric home appliances.

For example, as illustrated in FIG. 27, a level of brightness of a lighting apparatus 8020B may be adjusted using a gateway 8010 and a ZigBee module 8020A based on a genre of program airing on a television (TV) 8030 or a level of brightness of a screen of the TV 8030. For example, when a drama is being broadcast, requiring a cozy atmosphere, the lighting apparatus may adjust a color tone to lower a color temperature below 5,000K. As a further example, in a case in which a comedy program is being broadcast, requiring a relatively casual atmosphere, the lighting apparatus may adjust a color temperature to above 5,000K, and may adjust a color thereof to have white light in a blue tone.

In addition, a level of brightness of the lighting apparatus 8020B may be controlled by a mobile phone 8040 using a gateway 8010 and a ZigBee module 8020A.

The aforementioned ZigBee modules 7020 and 8020A may be modularized to be integrated with an optical sensor, and may be integrated with the lighting apparatus.

Visible light wireless communication technology may be wireless communication technology wirelessly transferring information using light having a wavelength band of visible light visually recognizable by the naked eye. Such visible light wireless communication technology may be distinguished from conventional wired optical communication technology and infrared (IR) wireless communication technology in that visible light wireless communication technology uses light having a wavelength band of visible light, that is, a desired, or alternatively predetermined visible light frequency from the semiconductor device package described in the aforementioned example embodiments, and may be distinguished from wired optical communication technology in that visible light wireless communication technology has a wireless communication environment. In addition, visible light wireless communication technology may also be distinguished by advantages such as convenience of a free access of use without regulations or permission in terms of a frequency use unlike radio frequency (RF) wireless communication, excellent security, and visual recognizability by a user visually verifying a communication link, and more particularly, convergence technology capable of contemporaneously obtaining a unique purpose as a light source and a communications function.

Meanwhile, the lighting apparatus using the LED device may be utilized as interior and exterior vehicle light sources. Such an interior vehicle light source may be used as a vehicle interior light, a reading light, a dash light, or the like. Such an exterior vehicle light source may be used for all types of external lights, such as a headlight, a brake light, a turn signal light, a fog lamp, or a daytime running lamp.

The lighting apparatus using the LED device having a desired, or alternatively predetermined wavelength band may stimulate plant growth, may stabilize human moods, and may treat diseases. Further, the lighting apparatus using the LED device may be used as a light source for a robot, or in various types of mechanical equipment. Combined with benefits of the lighting apparatus using the LED device such as relatively low power consumption and relatively long lifespans, lighting apparatuses using a new and renewable energy power system such as a solar cell or wind power may be achieved.

As set forth above, according to example embodiments, the semiconductor device, the semiconductor device package, and the lighting apparatus capable of reducing or substantially preventing an occurrence of cracks in an IMC may be provided.

Various advantages and effects in example embodiments are not limited to the above-described descriptions and may be easily understood through explanations of concrete embodiments.

While example embodiments have been shown and described above, it will be apparent to those skilled in the art that modifications and variations could be made without departing from the scope of the example embodiments as defined by the appended claims.

What is claimed is:

1. A semiconductor device, comprising:
a light emitting structure including first and second conductivity-type semiconductor layers including $Al_xIn_yGa(1-x-y)N$, wherein $0 \leq x < 1$, $0 \leq y < 1$, and $0 \leq x+y < 1$, and an active layer between the first and second conductivity-type semiconductor layers; and
an interconnection bump including:
an under bump metallurgy (UBM) layer on an electrode of at least one of the first and second conductivity-type semiconductor layers, the UBM layer having a first surface opposite to a surface of the electrode and a second surface extending from an edge of the first surface and connecting to the electrode, wherein the second surface is a sloped sidewall of the UBM layer;
an intermetallic compound (IMC) on the first surface of the UBM layer;
a solder bump bonded to the UBM layer with the IMC therebetween; and
a barrier layer on the second surface of the UBM layer and substantially preventing the solder bump from diffusing into the second surface of the UBM layer.

2. The semiconductor device of claim 1, wherein the second surface of the UBM layer has a structure slightly inclined towards the electrode from the first surface of the UBM layer.

3. The semiconductor device of claim 1, wherein the second surface of the UBM layer is substantially perpendicular to the surface of the electrode.

4. The semiconductor device of claim 1, wherein the UBM layer has a monolayer structure including one of a Ni layer or a Cu layer.

5. The semiconductor device of claim 1, further comprising a passivation layer adjacent to the UBM layer on the electrode.

6. The semiconductor device of claim 5, wherein the passivation layer is spaced apart from the UBM layer on the electrode.

7. The semiconductor device of claim 5, wherein the passivation layer has a lower thickness than a thickness of the UBM layer.

8. A semiconductor device, comprising:
a light emitting structure having a plurality of electrodes; and
an interconnection bump on the plurality of electrodes, wherein the interconnection bump includes:
an under bump metallurgy (UBM) layer on the electrode, the UBM layer having a first surface opposite to a surface of the electrode and a second surface extending from an edge of the first surface and connecting to the electrode, wherein the second surface is a sloped sidewall of the UBM layer;
an intermetallic compound (IMC) on the first surface of the UBM layer;
a solder bump bonded to the UBM layer with the IMC therebetween; and
a barrier layer on the second surface of the UBM layer, the barrier layer substantially preventing the solder bump from diffusing into the second surface of the UBM layer.

9. The semiconductor device of claim 8, wherein the plurality of electrodes are along a single direction in the light emitting structure.

10. The semiconductor device of claim 8, wherein the light emitting structure includes first and second conductivity-type semiconductor layers including $Al_xIn_yGa(1-x-y)$ N, wherein 0≤x<1, 0≤y<1, and 0≤x+y<1, and an active layer between the first and second conductivity-type semiconductor layers.

11. A semiconductor device package comprising:
a package main body;
a semiconductor device on the package main body; and
an encapsulating portion encapsulating the semiconductor device,
wherein the semiconductor device includes:
a light emitting structure having a plurality of electrodes; and
an interconnection bump on the plurality of electrodes,
wherein the interconnection bump includes:
an under bump metallurgy (UBM) layer on the electrode, the UBM layer having a first surface opposite to a surface of the electrode and a second surface extending from an edge of the first surface and connecting to the electrode, wherein the second surface is a sloped sidewall of the UBM layer;
an intermetallic compound (IMC) on the first surface of the UBM layer;
a solder bump bonded to the UBM layer with the IMC therebetween; and
a barrier layer on the second surface of the UBM layer, the barrier layer substantially preventing the solder bump from diffusing into the second surface of the UBM layer.

12. The package of claim 11, wherein the encapsulating portion includes at least one type of phosphor.

13. A lighting apparatus, comprising:
a housing; and
at least one semiconductor device package in the housing, wherein the at least one semiconductor device package includes:
a package main body;
a semiconductor device on the package main body; and
an encapsulating portion encapsulating the semiconductor device,
wherein the semiconductor device includes:
a light emitting structure having a plurality of electrodes; and
an interconnection bump on the plurality of electrodes,
wherein the interconnection bump includes:
an under bump metallurgy (UBM) layer on the electrode, the UBM layer having a first surface opposite to a surface of the electrode and a second surface extending from an edge of the first surface and connecting to the electrode, wherein the second surface is a sloped sidewall of the UBM layer;
an intermetallic compound (IMC) on the first surface of the UBM layer;
a solder bump bonded to the UBM layer with the IMC therebetween; and
a barrier layer on the second surface of the UBM layer, the barrier layer substantially preventing the solder bump from diffusing into the second surface of the UBM layer.

14. The lighting apparatus of claim 13, further comprising a cover unit in the housing and encapsulating the at least one semiconductor device package.

15. A connection bump of a semiconductor device, the connection bump comprising:
at least one under bump metallurgy (UBM) layer on an electrode of the semiconductor device;
an intermetallic compound (IMC) on the UBM layer;
a solder bump on the IMC; and
a barrier layer between a sloped sidewall of the UBM layer and the IMC, the barrier layer being configured to substantially prevent at least one of the solder bump and the IMC from diffusing into the UBM layer, the barrier layer extending between an edge of a surface of the UBM that is opposite to the electrode and the electrode.

16. The connection bump of claim 15, wherein the barrier layer extends on a surface of the UBM layer that extends between the IMC and the electrode.

17. The connection bump of claim 15, wherein the barrier layer has a level of wettability with respect to at least one of the IMC and the solder bump such that at least one of the IMC and the solder bump cannot be formed on the barrier layer.

18. The connection bump of claim 15, wherein the barrier layer includes an oxide layer having at least one element of the UBM layer.

19. The connection bump of claim 15, wherein the UBM layer comprises at least a first layer and a second layer, the first layer being in contact with the electrode.

20. The connection bump of claim 19, wherein
the first layer includes al least titanium; and
the second layer includes at least one of nickel and copper.

* * * * *